United States Patent
Campbell et al.

(10) Patent No.: US 8,322,154 B2
(45) Date of Patent: Dec. 4, 2012

(54) CONTROL OF SYSTEM COOLANT TO FACILITATE TWO-PHASE HEAT TRANSFER IN A MULTI-EVAPORATOR COOLING SYSTEM

(75) Inventors: Levi A. Campbell, Poughkeepsie, NY (US); Richard C. Chu, Poughkeepsie, NY (US); Michael J. Ellsworth, Jr., Poughkeepsie, NY (US); Madhusudan K. Iyengar, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 691 days.

(21) Appl. No.: 12/556,031

(22) Filed: Sep. 9, 2009

(65) Prior Publication Data

US 2011/0056225 A1 Mar. 10, 2011

(51) Int. Cl.
*F25B 5/02* (2006.01)
*F25D 17/02* (2006.01)
*F28D 15/02* (2006.01)

(52) U.S. Cl. ............... 62/199; 62/200; 62/201; 62/205; 165/104.21; 361/700

(58) Field of Classification Search ............... 62/185, 62/199, 200, 201, 205, 222; 165/104.21, 165/104.33; 361/700
See application file for complete search history.

(56) References Cited

U.S. PATENT DOCUMENTS

| | | | |
|---|---|---|---|
| 3,578,014 A | 5/1971 | Gachot | |
| 4,430,866 A | 2/1984 | Willitts | |
| 5,491,649 A | 2/1996 | Friday et al. | |
| 5,782,101 A | 7/1998 | Dennis | |
| 5,829,264 A | 11/1998 | Ishigaki et al. | |
| 6,212,895 B1 | 4/2001 | Richardson | |
| 6,574,104 B2 | 6/2003 | Patel et al. | |
| 6,866,092 B1 * | 3/2005 | Molivadas | 165/104.21 |
| 6,973,793 B2 * | 12/2005 | Douglas et al. | 62/127 |
| 7,012,807 B2 | 3/2006 | Chu et al. | |
| 7,088,585 B2 | 8/2006 | Chu et al. | |
| 7,106,590 B2 | 9/2006 | Chu et al. | |

(Continued)

OTHER PUBLICATIONS

Campbell et al., "Condenser Structures with Fin Cavities Facilitating Vapor Condensation Cooling of Coolant", U.S. Appl. No. 12/491,287, filed Jun. 25, 2009.

(Continued)

*Primary Examiner* — Marc Norman
(74) *Attorney, Agent, or Firm* — Dennis Jung, Esq.; Kevin P. Radigan, Esq.; Heslin Rothenberg Farley & Mesiti P.C.

(57) ABSTRACT

A cooling system and method are provided for facilitating two-phase heat transfer from an electronics system including a plurality of electronic devices to be cooled. The cooling system includes a plurality of evaporators coupled to the electronic devices, and a coolant loop for passing system coolant through the evaporators. The coolant loop includes a plurality of coolant branches coupled in parallel, with each coolant branch being coupled in fluid communication with a respective evaporator. The cooling system further includes a control unit for maintaining pressure of system coolant at a system coolant supply side of the coolant branches within a specific pressure range at or above saturation pressure of the system coolant for a given desired saturation temperature of system coolant into the evaporators to facilitate two-phase heat transfer in the plurality of evaporators from the electronic devices to the system coolant at the given desired saturation temperature.

20 Claims, 6 Drawing Sheets

U.S. PATENT DOCUMENTS

| | | |
|---|---|---|
| 7,143,605 B2 | 12/2006 | Rohrer et al. |
| 7,191,954 B2 | 3/2007 | Kline |
| 7,222,502 B2 | 5/2007 | Kobayashi et al. |
| 7,309,209 B2 | 12/2007 | Amiot et al. |
| 7,315,448 B1 | 1/2008 | Bash et al. |
| 7,349,213 B2 | 3/2008 | Campbell et al. |
| 7,385,810 B2 | 6/2008 | Chu et al. |
| 7,392,823 B2 | 7/2008 | Dong et al. |
| 7,415,835 B2 * | 8/2008 | Cowans et al. ............ 62/190 |
| 7,418,825 B1 | 9/2008 | Bean, Jr. |
| 7,420,808 B2 | 9/2008 | Campbell et al. |
| 7,477,514 B2 | 1/2009 | Campbell et al. |
| 7,531,142 B2 | 5/2009 | Huziwara et al. |
| 7,559,207 B2 | 7/2009 | Knight et al. |
| 7,715,194 B2 | 5/2010 | Brewer et al. |
| 7,895,854 B2 | 3/2011 | Bash et al. |
| 7,903,409 B2 | 3/2011 | Patel et al. |
| 7,963,119 B2 * | 6/2011 | Campbell et al. ............ 62/259.2 |
| 8,018,718 B2 | 9/2011 | Goth et al. |
| 2002/0149909 A1 | 10/2002 | Konstad et al. |
| 2003/0057546 A1 | 3/2003 | Memory et al. |
| 2005/0115257 A1 | 6/2005 | Goth et al. |
| 2005/0244280 A1 | 11/2005 | Malone et al. |
| 2006/0126296 A1 * | 6/2006 | Campbell et al. ............ 361/700 |
| 2006/0180300 A1 | 8/2006 | Lenehan et al. |
| 2007/0119570 A1 | 5/2007 | Kuo et al. |
| 2007/0213881 A1 | 9/2007 | Belady et al. |
| 2007/0297136 A1 | 12/2007 | Konshak |
| 2008/0205003 A1 | 8/2008 | Belady |
| 2009/0080173 A1 | 3/2009 | Porter et al. |
| 2009/0126909 A1 | 5/2009 | Ellsworth, Jr. et al. |
| 2009/0126910 A1 | 5/2009 | Campbell et al. |
| 2009/0133866 A1 | 5/2009 | Campbell et al. |
| 2010/0032142 A1 | 2/2010 | Copeland et al. |
| 2010/0263855 A1 | 10/2010 | Arimilli et al. |
| 2011/0029152 A1 | 2/2011 | Patel et al. |
| 2011/0056674 A1 | 3/2011 | Campbell et al. |
| 2011/0056675 A1 | 3/2011 | Barringer et al. |
| 2011/0058637 A1 | 3/2011 | Campbell et al. |
| 2011/0060470 A1 | 3/2011 | Campbell et al. |

OTHER PUBLICATIONS

Campbell et al., "Apparatus and Method for Facilitating Immersion-Cooling of an Electronic Subsystem", U.S. Appl. No. 12/256,618, filed Oct. 23, 2008.

Campbell et al., "Liquid Cooling Apparatus and Method for Cooling Blades of an Electronic System Chassis", U.S. Appl. No. 12/256,623, filed Oct. 23, 2008.

Zamanabadi et al., "Hybrid Control Challenges in Refrigeration Systems", Danfoss A/S, Denmark, Advanced Engineering—Refrigeration and Air Conditioning, EECI (2007).

Campbell et al., Office Action for U.S. Appl. No. 12/556,053, filed Sep. 9, 2009 (U.S. Patent Publication No. 2011/0056674 A1), dated Dec. 21, 2011.

Campbell et al., Office Action for U.S. Appl. No. 12/556,066, filed Sep. 9, 2009 (U.S. Patent Publication No. 2011/0060470 A1), dated Mar. 22, 2012.

Office Action for U.S. Appl. No. 12/556,066 (U.S. Patent Publication No. 2011/0060470 A1), dated Aug. 31, 2011.

Campbell et al., Office Action for U.S. Appl. No. 12/556,066, filed Sep. 9, 2009 (U.S. Patent Publication No. 2011/0060470 A1), dated Aug. 27, 2012.

* cited by examiner

CONTROL OF SYSTEM COOLANT TO FACILITATE TWO-PHASE HEAT TRANSFER IN A MULTI-EVAPORATOR COOLING SYSTEM

BACKGROUND

The present invention relates in general to heat transfer mechanisms, and more particularly, to cooling apparatuses and methods for removing heat generated by a plurality of electronic devices. Still more particularly, the present invention relates to fluidic cooling apparatuses and methods for cooling a plurality of electronic devices.

The industry trend has been to continuously increase the number of electronic devices within a computing system environment. Compactness allows for selective fabrication of smaller and lighter devices that are more attractive to the consumer. Compactness also allows circuits to operate at higher frequencies and at higher speeds due to the shorter electrical connection distances in such devices. Despite these advantages, providing many electronic devices in a small footprint can create device performance challenges. One of these challenges is thermal management of the overall environment. Heat dissipation issues, if unresolved, can result in electronic and mechanical failures that will affect system performance, irrespective of the size of the environment.

In many computing environments, microprocessors continue to increase in performance, with the active circuitry of the microprocessor chip being driven to an ever smaller footprint, leading to ever higher heat loads and heat fluxes. Notwithstanding this, reliability constraints often dictate that operating temperature of the devices not exceed a known maximum value.

The existing art has struggled with designing high-performance cooling solutions that can efficiently remove this heat. Conventional cooling solutions depend on conduction cooling through one or more thermal interfaces to an air-cooled heat sink, possibly employing a spreader or vapor chamber. To increase the heat removal capability of air-cooled systems, greater airflow is typically needed. Unfortunately, providing greater airflow is not always possible. Many factors must be taken into consideration in providing ever greater airflow, among which are acoustic noise considerations, as well as power concerns.

As an alternative, liquid-cooling methods have recently been incorporated into certain designs. Various types of liquid coolants provide different cooling capabilities. For example, fluid such as refrigerants or other dielectric liquids (e.g., fluorocarbon liquids) exhibit lower thermal conductivity and specific heat properties compared with liquids such as water or other aqueous fluids. These dielectric liquids have an advantage, however, in that they may be placed in direct physical contact with electronic devices and their interconnects without adverse effects, such as corrosion or electrical short circuits. Other cooling liquids, such as water or other aqueous fluids, exhibit superior thermal conductivity and specific heat compared with dielectric fluids. Water-based coolants, however, must be kept from physical contact with electronic devices and interconnects, since corrosion and electrical short circuit problems are otherwise likely to result.

BRIEF SUMMARY

As the need for increased computer performance continues to increase, the amount of heat and heat density (i.e., heat per unit volume) continues to increase. This, plus the desire to reduce power consumption in the typical data center, drives a need for an effective two-phase liquid-cooling solution. In a two-phase liquid-cooling solution, the heat that is transferred by convection is done so principally by a change in coolant phase. Building on this approach, a two-phase liquid-cooling solution is presented herein for effectively cooling a plurality of electronic devices in parallel.

Briefly summarized, the present invention comprises in one aspect a cooling system which comprises a plurality of evaporators configured to couple to a plurality of electronic devices to be cooled, a coolant loop for passing system coolant through the plurality of evaporators, and a control unit for maintaining pressure of system coolant within the coolant loop. The coolant loop includes a plurality of coolant branches coupled in parallel, with each coolant branch being coupled in fluid communication with a respective evaporator of the plurality of evaporators. The control unit maintains pressure of system coolant at a system coolant supply side of the plurality of coolant branches coupled in parallel within a specific pressure range at or above saturation pressure of the system coolant for a desired saturation temperature of system coolant into the plurality of evaporators, to thereby facilitate two-phase heat transfer in the plurality of evaporators from the plurality of electronic devices to the system coolant at the desired saturation temperature.

In another aspect, a cooled electronics system is provided which includes a plurality of electronic devices capable of generating differing amounts of heat dependent on the operational states thereof, and a cooling system for cooling the plurality of electronic devices. The cooling system includes a plurality of evaporators coupled to the plurality of electronic devices, a coolant loop coupled to pass system coolant through the plurality of evaporators, and a control unit for maintaining pressure of system coolant within the coolant loop. The coolant loop includes a plurality of coolant branches coupled in parallel, with each coolant branch being coupled in fluid communication with a respective evaporator of the plurality of evaporators. The control unit maintains pressure of system coolant at a system coolant supply side of the plurality of coolant branches coupled in parallel within a specific pressure range at or above saturation pressure of the system coolant for a desired saturation temperature of system coolant into the plurality of evaporators, to thereby facilitate two-phase heat transfer in the plurality of evaporators from the plurality of electronic devices to the system coolant at the desired saturation temperature.

In a further aspect, a method of facilitating two-phase heat transfer in a coolant loop of a cooling system is provided. The method includes: coupling a plurality of evaporators to a plurality of electronic devices to be cooled and passing system coolant through the plurality of evaporators in parallel employing a coolant loop, the coolant loop comprising a plurality of coolant branches coupled in parallel, each coolant branch being coupled in fluid communication with a respective evaporator of the plurality of evaporators; and regulating pressure of system coolant at a system coolant supply side of the plurality of coolant branches to maintain pressure of system coolant at the system coolant supply side of the plurality of coolant branches within a specific pressure range at or above saturation pressure of the system coolant for a desired saturation temperature of system coolant into the plurality of evaporators to facilitate two-phase heat transfer in the plurality of evaporators from the plurality of electronic devices to the system coolant at the desired saturation temperature.

Further, additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

As used herein, "electronic device" comprises one or more heat-generating electronic devices of a computer system or other electronic system requiring cooling. In one example, the electronic device is or includes an integrated circuit chip, a semiconductor chip and/or any other electronic device(s) requiring cooling, and may either be unpackaged or packaged in an electronic module. As one example, the electronic device may comprise part of an electronic system disposed, for example, in an electronics rack, such as a rack-mounted server system. A "liquid-to-air heat exchanger" means any heat exchange mechanism through which liquid coolant can circulate; and includes, one or more discrete heat exchange devices coupled either in series or in parallel. A heat exchange device may comprise, for example, one or more coolant flow paths, formed of thermally conductive fluid conduits (such as copper, brass or other tubing) in thermal contact with a plurality of air-cooled fins (formed of a thermally conductive material, such as copper). Unless otherwise specified, size, configuration and construction of the liquid-to-air heat exchanger can vary without departing from the scope of the present invention. A "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can also vary without departing from the scope of the invention disclosed herein. The term "liquid-cooled cold plate" refers to any thermally conductive structure having one or more channels (or passageways) formed therein for flowing of liquid coolant therethrough.

One example of system coolant employed in a cooling system such as described herein is a dielectric liquid (such as a fluorocarbon or a hydrofluoroether (HFE) liquid) or a refrigerant liquid (such as R-245fa). One example of facility coolant for a cooling system such as described herein is water. Those skilled in the art will note, however, that the cooling concepts disclosed herein are readily adapted to use with other types of coolant on the system coolant side and/or facility coolant side, while still maintaining the advantages and unique features of the present invention. For example, the system coolant may also comprise water. Still further, one or more of the fluids may comprise an aqueous solution, a brine, a fluorocarbon liquid, a hydrofluoroether liquid, a liquid metal, or other similar coolant, or refrigerant.

Reference is made below to the drawings, which are not drawn to scale to facilitate understanding of the present invention, wherein the same reference numbers are used throughout different figures to designate the same or similar components.

Figure 1:
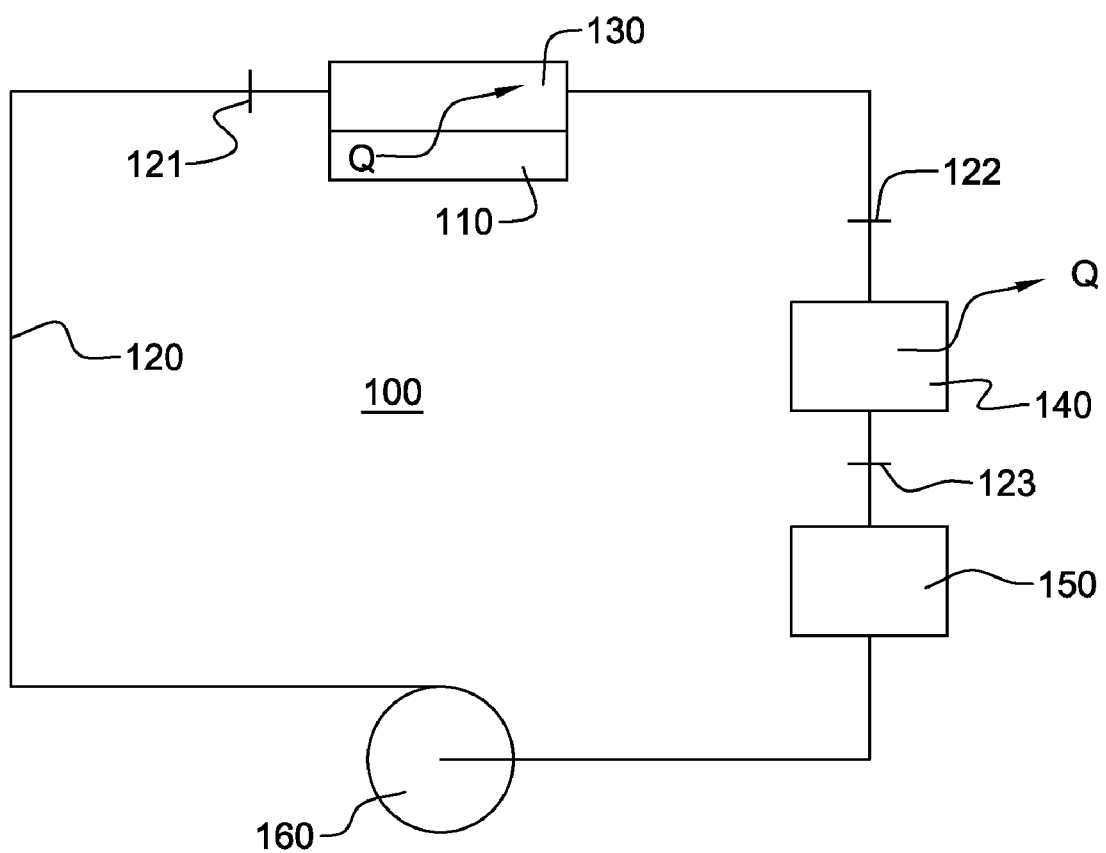
FIG. 1 is a schematic of one embodiment of a cooling system with two-phase system coolant cooling of an electronic device, in accordance with an aspect of the present invention.

As noted, as the need for increased computer performance continues to increase, the amount of heat and heat density increases, which when combined with the desire to reduce power consumption in a typical data center, drives the need today for an effective two-phase liquid-cooling solution. FIG. 1 depicts one embodiment of a cooled electronic system 100 utilizing a closed loop, two-phase liquid-cooling solution, wherein heat transferred by convection is principally absorbed by a change in phase of the system coolant. In this embodiment, the coolant loop 120 is a closed loop, and heat transferred into the system coolant (from, e.g., one or more electronic devices, such as one or more processor modules 110) is absorbed via liquid boiling in an evaporator 130. Specifically, system coolant at least partially undergoes a phase change from liquid to gaseous phase as heat from the electronic device is added to the system coolant within the evaporator. After leaving evaporator 130, heat is removed from the system coolant in a condenser 140, wherein the system coolant in gaseous phase condenses back to liquid phase. Although not shown, condenser 140 may comprise an air-to-liquid heat exchanger or a liquid-to-liquid heat exchanger for facilitating this removal of heat from the system coolant. A pump 160 circulates system coolant through coolant loop 120, and a reservoir 150 is disposed upstream of pump 160 to prevent the pump from cavitating (i.e., assuming that the pump is a centrifugal pump). Reservoir 150 also accommodates expansion of the system coolant with temperature variations.

For the two-phase cooling system to operate effectively, fluid entering the evaporator at location 121 in FIG. 1 should be, for a given desired saturation temperature of system coolant within the evaporator, at a pressure which is equal to or above the saturation pressure of the system coolant at the desired saturation temperature. The amount of pressure above saturation pressure at the desired saturation temperature dictates the degree of sub-cooling (i.e., the degree to which the coolant is below its saturation temperature) associated with the entering fluid. As the fluid picks up heat from the electronic device(s), some fraction (or all of the system coolant) changes phase to a vapor. It is in this thermodynamic state that the coolant enters the condenser (reference location 122 in the cooling system of FIG. 1), albeit at a lower pressure than at location 121. As heat is removed from the system coolant within the condenser, the vaporized coolant returns to liquid state and is forwarded (reference location 123) to reservoir 150. Note that the pump, in addition to circulating the coolant, will raise pressure of the coolant on the way back to location 121 at the system coolant supply side of the evaporator.

One issue when operating a two-phase cooling system in a large scale computing system (such as the Power 575™ supercomputer or BladeCenter® system, offered by International Business Machines Corporation, of Armonk, N.Y.), is that there are many electronic devices (e.g., processor modules) requiring a cooling approach which utilizes many evaporators connected in parallel. These electronic devices will operate over a wide range of power, and will not all be at the same power level at the same time. This can result in highly non-uniform and unstable coolant flow conditions that can lead to excessively high temperatures within the two-phase cooling system. For example, if one or a few of the electronic devices are in a high power state, and other electronic devices are in a relatively low or no power state, then the evaporator(s) associated with the high power electronic device(s) will experience a much greater pressure drop due to the volume occupied by the system coolant in the gaseous state. This higher pressure drop will skew the flow distribution in the direction of the low or no power state electronic device(s), essentially starving the evaporator(s) that are coupled to the electronic device(s) that are in the high power state, potentially leading to a thermal runaway condition. Another difficulty with two-phase operation is that, on the system level, the variations in system heat transfer (driven by operating the electronic devices differently between idle and full power modes) can result in undesirable fluctuations in system coolant pressure, which can affect the temperature at which boiling takes place in the individual evaporators. Disclosed hereinbelow, therefore, is a cooling system and method of control for a two-phase cooling approach that addresses these issues.

Figure 2:
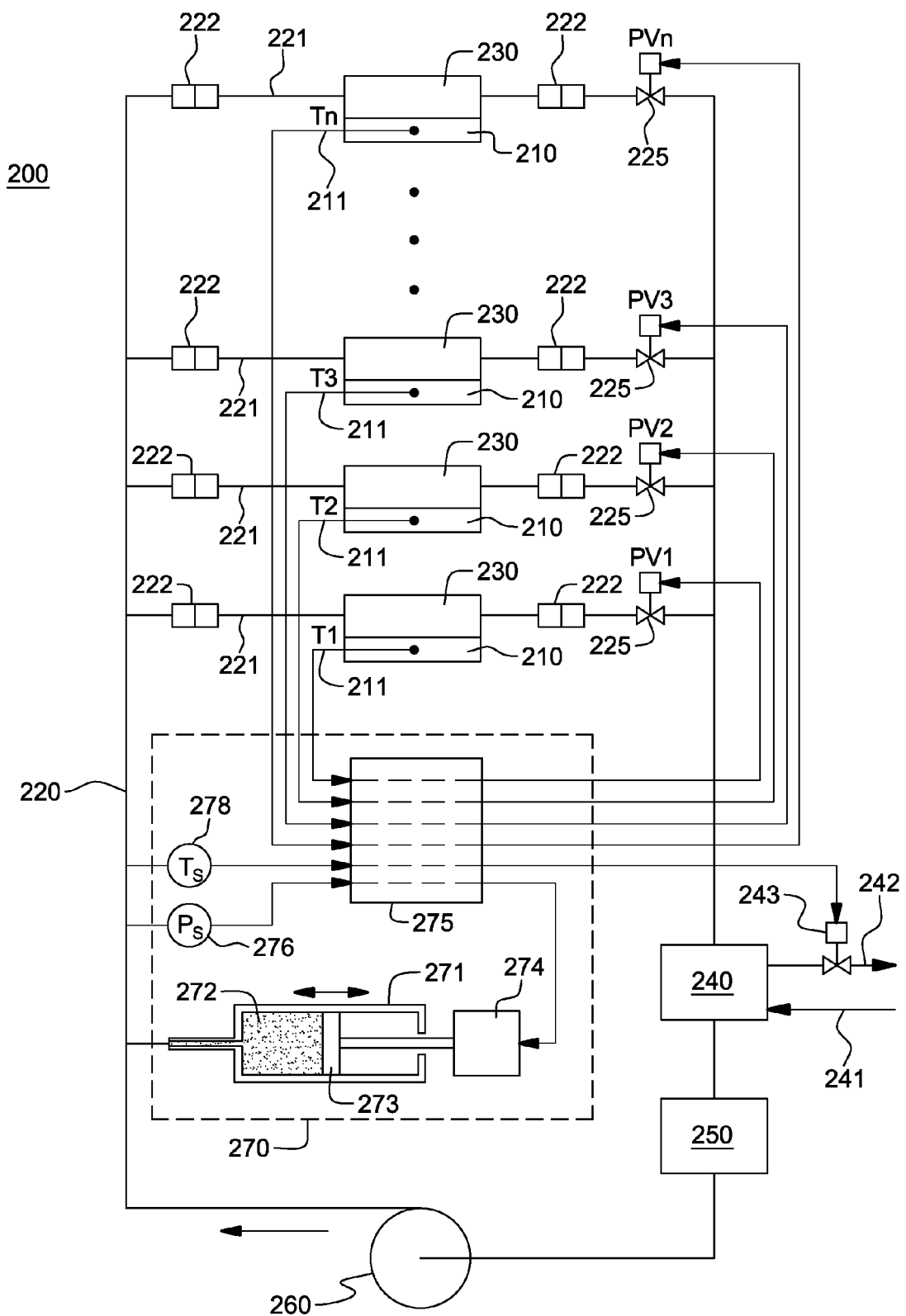
FIG. 2 is a schematic of one embodiment of a cooling system with two-phase system coolant cooling of a plurality of electronic devices in parallel, in accordance with an aspect of the present invention.

FIG. 2 depicts one embodiment of an electronic cooling system, generally denoted 200, in accordance with an aspect of the present invention. As shown, cooled electronic system 200 comprises n electronic devices 210 which are coupled by the cooling system for cooling in parallel. In the cooling system, a closed coolant loop 220 passes system coolant through a plurality of evaporators 230. The coolant loop includes a plurality of coolant branches 221 coupled in parallel, with each coolant branch 221 being in fluid communication with a respective evaporator 230. Note that although shown in a 1-to-1 relation, each evaporator 230 may be coupled to cool one or more electronic devices 210. Further, as specific examples, electronic devices 210 may be disposed within a common electronic subsystem, such as a common electronic drawer (or node) of an electronics rack, or in different electronic subsystems, such as different electronic drawers (or nodes) of an electronics rack. In this embodiment, quick connect couplings 222 are provided on each side of evaporator 230 for facilitating coupling of the evaporator (or evaporator and electronic device as a subunit) into one of the respective coolant branches 221 of coolant loop 220. By way of example, quick connect couplings 222 may comprise any one of various types of commercially available couplings, such as those available from Colder Products Company, of St. Paul, Minn., U.S.A., or Parker Hannifin, of Cleveland, Ohio, U.S.A. Coupled in fluid communication with each coolant branch 221 is a flow control valve PV1, PV2, PV3 . . . PVn 225, shown in the embodiment of FIG. 2 on the system coolant return side of evaporators 230. In one embodiment, these flow control valves comprise electrically-controllable proportional valves, which are electrically coupled to and controlled by a control unit 270 of the cooling system.

In operation, as fluid passes through the respective evaporators, heat from the associated electronic devices is transferred to the system coolant and some fraction (or all of the system coolant) changes phase to vapor. In this thermodynamic state, the system coolant is transferred to a condenser 240, where heat is removed from the system coolant, changing the coolant phase back to liquid state. Condenser 240 may comprises an air-to-liquid heat exchanger or a liquid-to-liquid heat exchanger to facilitate this transfer. In the embodiment of FIG. 2, a liquid-to-liquid heat exchanger is assumed, wherein the system coolant passes through one coolant flow path, and facility coolant passes through another coolant flow path within the heat exchanger. As shown, a facility coolant supply line 241 couples to condenser 240 for supplying facility coolant to the heat exchanger, and a facility coolant return line 242 returns the exhausted facility coolant to a facility coolant source (not shown). A facility coolant control valve 243 is associated with the facility coolant return line 242 (by way of example) for controlling the flow of facility coolant through condenser 240, and hence, for controlling the cooling rate applied to the system coolant passing through condenser 240. This facility coolant control valve 243 may itself also comprise an electrically-controlled proportional valve, controlled, for example, by control unit 270 of the cooling system (as explained further below). After passing through condenser 240, system coolant is collected in a reservoir 250, from which the system coolant is pumped 260 to repeat the two-phase heat transfer cycle.

In the illustrated embodiment, control unit 270 includes a pressure control unit for facilitating maintaining pressure of system coolant within the coolant loop at the system coolant supply side of the plurality of coolant branches 221 within a specific pressure range (i.e., about a specific pressure) at or above saturation pressure of the system coolant for a desired saturation temperature of system coolant into the evaporators 230. In one embodiment, the pressure control unit comprises a pressure vessel 271 with system coolant 272 being disposed within the pressure vessel. An adjustable pressurizing mechanism 273 also resides within pressure vessel 271. In the embodiment illustrated, this adjustable pressurizing mechanism is a piston which controllably reciprocates within the vessel to either increase pressure on system coolant 272 or decreases pressure on system coolant 272 within the pressure vessel. A coolant line couples pressure vessel 271 in fluid communication with coolant loop 220 of cooling system 200. In the embodiment illustrated, this coupling is at the system coolant supply side of the plurality of coolant branches 221 (i.e., at the supply side of the plurality of evaporators).

A regulator mechanism 274 is also provided coupled to the pressurizing mechanism to facilitate maintaining system coolant within the coolant loop at the system coolant supply side of the coolant branches within a specific pressure range at or above the desired saturation pressure. In one embodiment, the regulator mechanism is a stepper motor coupled to the piston for adjusting position of the piston within the pressure vessel, and thus, pressure of system coolant within the pressure vessel, and hence within the coolant loop. A pressure sensor $P_S$ 276 is coupled to coolant line 220 at, for example, the system coolant supply side of the coolant branches 221 to sense pressure of system coolant within the coolant loop. Alternatively, the pressure sensor could be coupled to sense pressure of system coolant within the pressure vessel, which as noted, is in fluid communication with the coolant loop at the system coolant supply side of the coolant branches. A controller 275 is coupled to pressure sensor 276 and stepper motor 274 for automatically controlling positioning of the piston within the pressure vessel via the stepper motor to maintain pressure of system coolant within the pressure vessel (and hence, within the coolant loop) at the system coolant supply side of the plurality of coolant branches equal to or above the saturation pressure of system coolant for the desired saturation temperature of system coolant into the plurality of evaporators.

Figure 3:
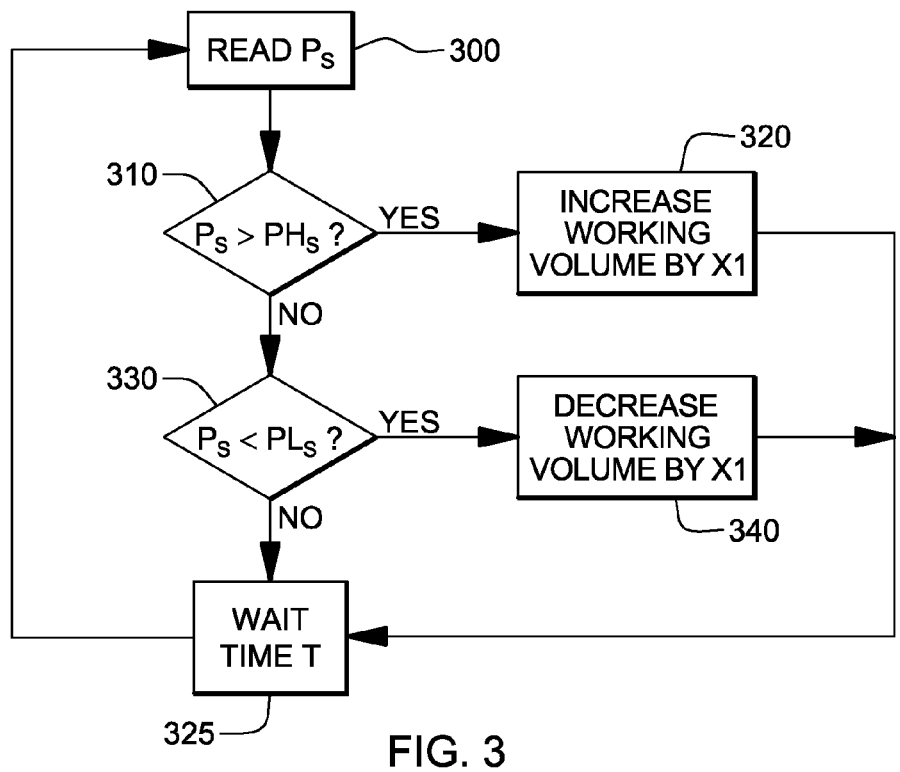
FIG. 3 depicts one embodiment of logic for controlling pressure of system coolant within the coolant loop of the cooling system of FIG. 2, in accordance with an aspect of the present invention.

As a specific control example, FIG. 3 depicts one embodiment of logic implemented by the controller in the cooling system of FIG. 2 for controlling pressure within the closed coolant loop. The system coolant pressure $P_S$ is read 300, and the logic determines whether the sensed pressure $P_S$ is greater than an upper pressure threshold $PH_S$ for the system coolant in the coolant loop 310. If "yes", then the stepper motor is actuated to move the piston to increase the working volume of system coolant within pressure vessel by a defined amount X1 320, thereby decreasing pressure of system coolant within the coolant loop at the system coolant supply side of the coolant branches. The logic then waits a defined time interval T 325, before obtaining a next system coolant pressure $P_S$ reading 300. If the sensed pressure is not greater than the upper pressure threshold $PH_S$, then the logic determines whether the sensed pressure $P_S$ is less than a lower pressure threshold $PL_S$ 330. If "yes", then the stepper motor is actuated to move the piston to decrease the working volume within the pressure vessel by the defined amount X1 340, which functions to increase the system coolant pressure within the coolant loop at the system coolant supply side of the parallel-connected coolant branches. After adjusting the piston within the pressure vessel, the logic waits predefined time T 325, before obtaining a next system coolant pressure $P_S$ reading 300, and repeating the control process.

Figure 4:
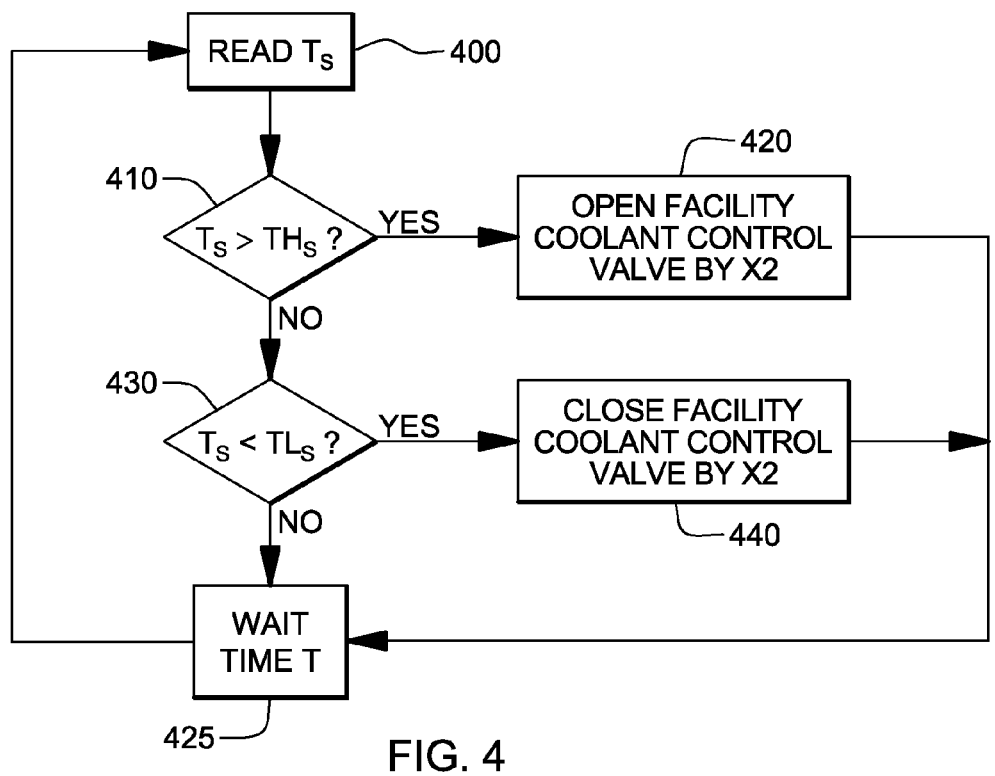
FIG. 4 depicts one embodiment of logic for controlling temperature of system coolant within the coolant loop of the cooling system of FIG. 2, in accordance with an aspect of the present invention.

As illustrated in FIG. 2, control unit 270 further includes a temperature sensor 278 for sensing system coolant temperature $T_S$ at the system coolant supply side of the coolant branches 221. This sensed temperature is employed by controller 275 in adjusting flow of facility coolant through condenser 240, and thus, in controlling the amount of cooling applied to system coolant passing through the condenser in order to maintain temperature of the system coolant at the system coolant supply side of the plurality of branches at the desired saturation temperature, or at a temperature below saturation temperature (i.e., sub-cooling). FIG. 4 illustrates one embodiment of logic implemented by the controller for controlling temperature of the system coolant within the coolant loop 220.

Referring to FIG. 4, the system coolant temperature $T_S$ is ascertained 400, and the logic determines whether the sensed temperature $T_S$ is greater than an upper temperature threshold $TH_S$ 410. If "yes", then the controller opens the facility coolant control valve by a set amount X2 420, which increases the amount of facility coolant flow through the liquid-to-liquid heat exchanger of the condenser, thus increasing the amount of cooling applied to the system coolant flowing through the condenser. After adjusting the facility coolant control valve, the logic waits a defined time interval T 425 before obtaining a next temperature sensor reading 400. If the sensed temperature $T_S$ is less than the upper temperature threshold $TH_S$ 430, then the logic determines whether the sensed temperature $T_S$ is less than a lower temperature threshold $TL_S$. If "yes", then the controller closes the facility coolant control valve by the defined amount X2 440, to reduce the amount of facility coolant flowing through the condenser, and thus reduce the cooling applied to the system coolant flowing through the condenser. After adjusting the flow control valve, the logic waits the defined time interval T 425 before obtaining a next temperature sensor reading 400. Note that the defined time interval T employed in the logic of FIG. 3 and the logic of FIG. 4 (as well as the logic of FIGS. 5 & 7 described below) may be the same or different, depending upon the implementation.

As noted briefly above, a plurality of flow control valves PV1, PV2, PV3 . . . PVn 225 are associated with the plurality of coolant branches 221 of coolant loop 220 in the cooled electronic system of FIG. 2. Each flow control valve 225 is, in one example, an electrically-controlled proportional valve, that is disposed in fluid communication with an associated coolant branch 221 of the coolant loop (to control the flow of system coolant through the associated coolant branch). In the illustrated embodiment, the flow control valves are disposed at the system coolant return side of evaporators 230 (by way of example) to facilitate adjustment by control unit 270 of the system coolant flow through the associated coolant branch, including the respective evaporator 230. In the embodiment of FIG. 2, this adjustment is based on a sensed temperature T1, T2, T3 . . . Tn 211 associated with the respective electronic device 210. This aspect of the system control facilitates maintaining both electronic device temperature at or below a selected maximum operating temperature, as well as proper coolant system flow distribution, based on power fluctuations of the electronic devices 210.

Figure 5:
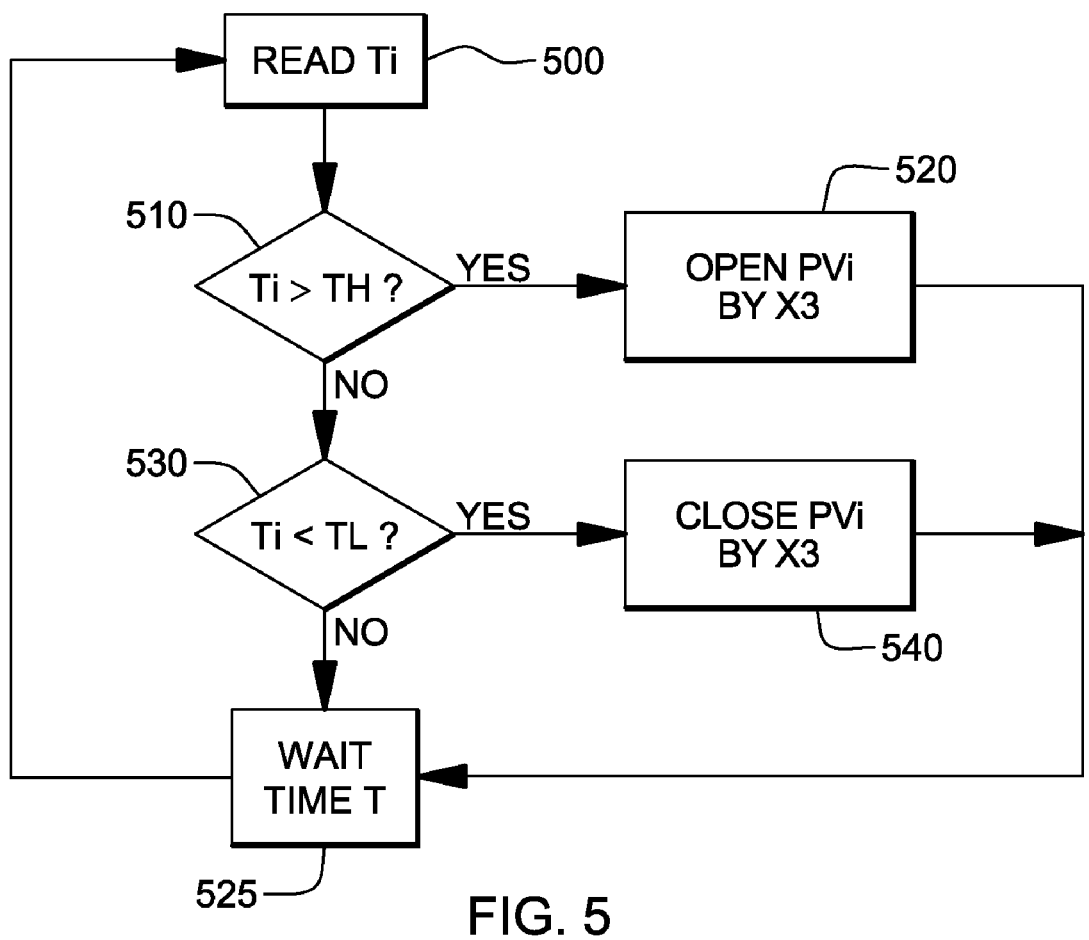
FIG. 5 depicts one embodiment of logic for controlling system coolant flow through the plurality of evaporators of the cooling system of FIG. 2 based on a sensed temperature associated with the respective electronic device(s) to be cooled, in accordance with an aspect of the present invention.

FIG. 5 illustrates one embodiment of logic for controlling system coolant flow through each coolant branch employing the associated flow control valve PV1, PV2, PV3 . . . PVn of the cooling system of FIG. 2. The control logic of FIG. 5 is repeated by the controller for each coolant branch to control the system coolant flow through that branch. An associated temperature Ti is obtained for the one or more electronic devices being cooled by the respective evaporator in fluid communication with the particular coolant branch (i) 500. Logic then determines whether the sensed temperature Ti is greater than an upper temperature threshold TH 510. If "yes", then the corresponding flow control valve PVi is opened by a set amount X3 520 to increase the amount of system coolant flow through the evaporator, thus increasing the amount of cooling applied to the electronic device. If the associated temperature Ti is not greater than the upper temperature threshold TH, then the logic determines whether it is less than a lower temperature threshold TL 530. If "yes", then the controller closes the associated flow control valve PVi by the amount X3 540, to decrease the amount of system coolant flow through the evaporator, thus reducing the amount of cooling applied to the electronic device. After adjusting the flow control valve, the logic waits a defined time interval T 525 before obtaining a next temperature reading Ti associated with the electronic device to be cooled by the evaporator coupled to the associated coolant branch.

Those skilled in the art will note that the above-described cooled electronic system is capable of regulating the system coolant supply manifold pressure and temperature, as well as regulating the flow of system coolant through the individual evaporators in the parallel-coupled coolant branches. Regulation of system coolant pressure and temperature at the system coolant supply side of the evaporators ensures that the desired thermodynamic coolant conditions, i.e., saturated liquid or a predefined sub-saturation-cooled liquid, are achieved and maintained for every evaporator in the cooling system. The flow control valves placed downstream of each evaporator are electrically controlled by the controller based on, for example, an associated or characteristic device temperature of the electronic device or module in the associated coolant branch. This aspect of system control is designed to maintain both temperature of the electronic device (within, for example, a desired operating range), as well as maintain proper system flow distribution (based on power fluctuations between the electronic devices). That is, the flow control valves are adjusted to maintain adequate system coolant flow to all evaporators coupled in parallel based on the time-varying heat being generated by the respective electronic devices being cooled by the parallel-cooled evaporators. As an electronic device's power needs increase, its associated temperature increases, therefore calling for additional flow of system coolant through the associated evaporator. Similarly, as an electronic device's power decreases, the associated flow control valve will be at least partially closed to ensure that the higher-power-consuming devices will receive the system coolant flow they needed.

Figure 6:
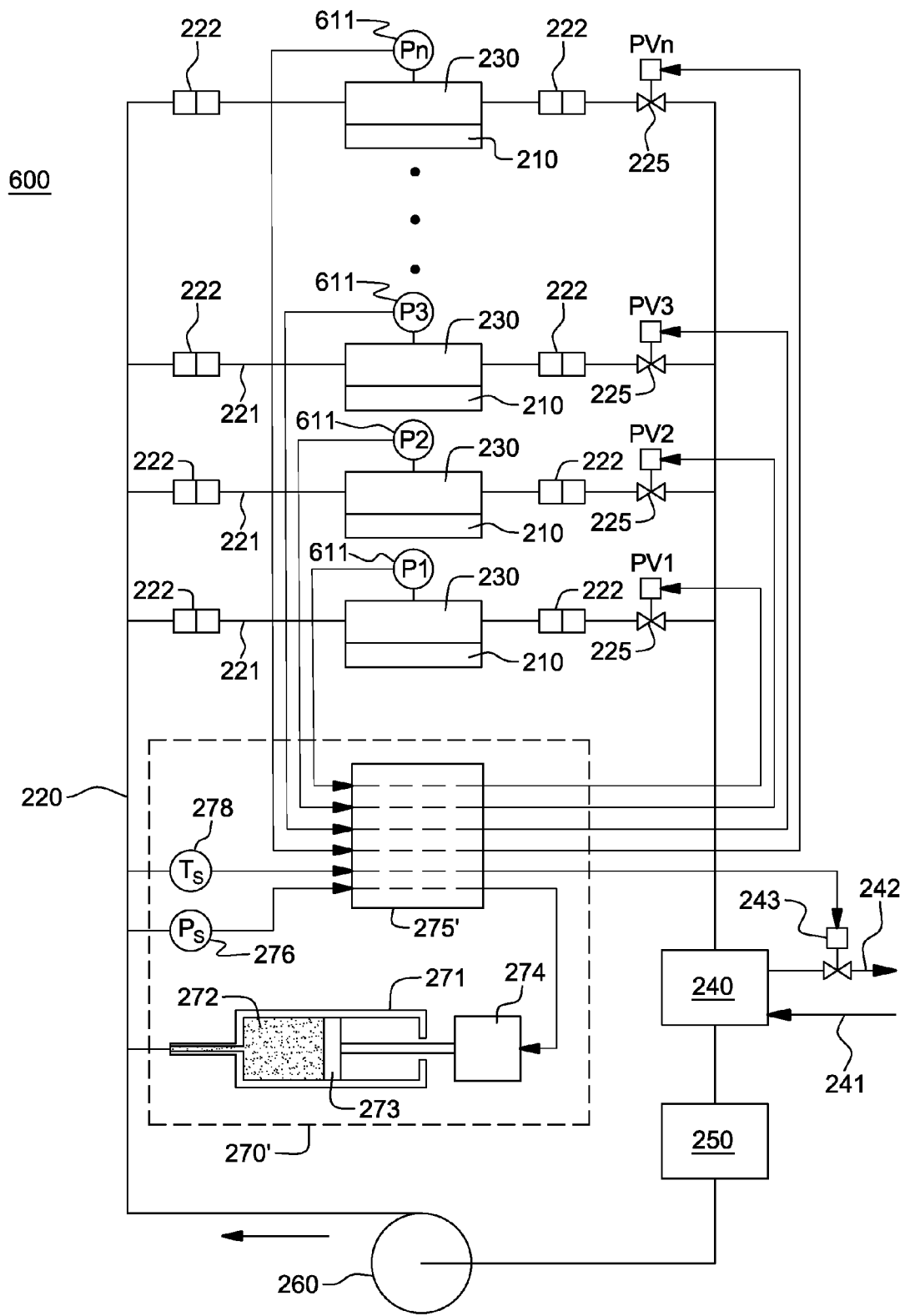
FIG. 6 is a schematic of an alternate embodiment of a cooling system with two-phase system coolant cooling of a plurality of electronic devices in parallel, in accordance with an aspect of the present invention.
Figure 7:
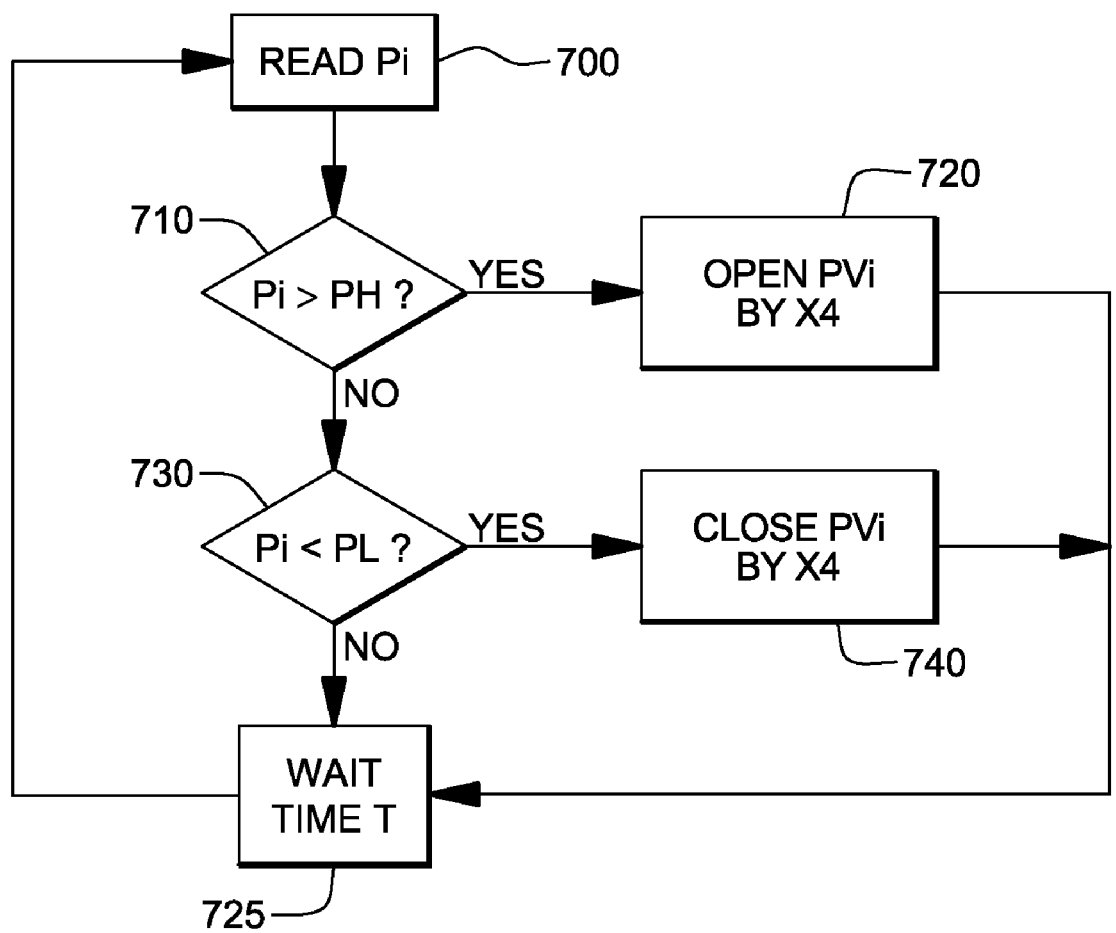
FIG. 7 is a flowchart of one embodiment of logic for controlling system coolant flow through the plurality of evaporators of the cooling system of FIG. 6 based on a sensed pressure of system coolant within the respective evaporator of the associated coolant loop branch, in accordance with an aspect of the present invention.

FIGS. 6 & 7 depict an alternate embodiment of the cooled electronics system of FIG. 2.

In the alternate system embodiment of FIG. 6, a cooled electronics system 600 is presented which is identical to that described above in connection with FIG. 2, with the exception that system coolant pressure 611 within the evaporators 230 is monitored and employed by controller 275' in controlling fluid flow through the respective flow control valves 225 of coolant branches 221. With increase in temperature of an electronic device 210, the system coolant pressure within the respective evaporator 230 will increase. The pressure sensors P1, P2, P3 . . . Pn 611 are thus employed to sense the current system coolant pressure within the respective evaporator 230 based on the fluctuating power consumed by the respective electronic devices 210.

FIG. 7 illustrates one embodiment of logic implemented by controller 275' of cooled electronics system 600 of FIG. 6. As illustrated, the controller reads the pressure of system coolant Pi 700 within each evaporator of the parallel-coupled coolant branches of the coolant loop. The ascertained system coolant pressure Pi within each evaporator is compared against an upper pressure threshold PH 710. If the pressure Pi within an evaporator is greater than the upper pressure threshold PH, then the controller opens the corresponding flow control valve PVi by a set amount X4 720, which increases the flow of system coolant through the evaporator, dropping the pressure of system coolant within the evaporator and facilitating maintaining system coolant temperature into the evaporator at the desired saturation temperature, as well as mitigating against the excessive pressure drop scenario described above. Thereafter, the logic waits time T 725, before obtaining a next pressure reading Pi 700 and repeating the control loop. If the sensed pressure Pi is at or below the upper pressure threshold PH, then the logic determines whether the pressure Pi is below a lower pressure threshold PL 730. If "yes", then the associated flow control valve PVi is closed by amount X4 740, and processing waits time T 725 before obtaining a next pressure reading Pi 700 and repeating the control loop.

Note that control unit 270' depicted in the cooled electronics system 600 embodiment of FIG. 6 is identical to the control unit 270 of the cooled electronics system 200 of FIG. 2, with the exception that the above-described control logic is provided for monitoring pressure within the respective evaporators and controlling system coolant flow through the evaporators based on the sensed pressure values in the evaporators. Operation of the remaining components of the cooled electronics system of FIG. 6 is as described above in connection with the cooled electronics system embodiment of FIG. 2.

Further details and variations of liquid-based cooling apparatuses and methods for cooling electronics systems and/or electronics racks are disclosed in co-filed U.S. patent application Ser. No. 12/556,019, entitled "Pressure Control Unit and Method Facilitating Single-Phase Heat Transfer in a Cooling System", and co-filed U.S. patent application Ser. No. 12/556,053, entitled "System and Method for Facilitating Parallel Cooling of Liquid-Cooled Electronics Racks", and co-filed U.S. patent application Ser. No. 12/556,066, entitled "Cooling System and Method Minimizing Power Consumption in Cooling Liquid-Cooled Electronics Racks", and co-filed U.S. patent application Ser. No. 12/556,040, entitled "Apparatus and Method for Adjusting Coolant Flow Resistance Through Liquid-Cooled Electronics Rack(s)", the entirety of each of which is hereby incorporated herein by reference.

As will be appreciated by one skilled in the art, aspects of the controller described above may be embodied as a system, method or computer program product. Accordingly, aspects of the controller may take the form of an entirely hardware embodiment, an entirely software embodiment (including firmware, resident software, micro-code, etc.) or an embodiment combining software and hardware aspects that may all generally be referred to herein as a "circuit", "module" or "system". Furthermore, aspects of the controller may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, or any suitable combination thereof A computer-readable signal medium may be any computer-readable medium that is not a computer-readable storage medium and that can communicate, propagate, or transport a program for use by or in connection with an instruction execution system, apparatus or device.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language or similar programming languages.

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling system comprising:
  a plurality of evaporators configured to couple to a plurality of electronic devices to be cooled;
  a coolant loop for passing system coolant through the plurality of evaporators, the coolant loop comprising a plurality of coolant branches coupled in parallel, each coolant branch being coupled in fluid communication with a respective evaporator of the plurality of evaporators; and
  a control unit for maintaining pressure of system coolant at a system coolant supply side of the plurality of coolant branches within a specific pressure range at or above saturation pressure of the system coolant for a desired saturation temperature of system coolant into the plurality of evaporators to facilitate two-phase heat transfer in the plurality of evaporators from the plurality of electronic devices to the system coolant at the desired saturation temperature.

2. The cooling system of claim 1, further comprising a plurality of flow control valves, each flow control valve being in fluid communication with an associated coolant branch of the plurality of coolant branches of the coolant loop and facilitating control unit adjustment of system coolant flow through the respective evaporator in fluid communication with the associated coolant branch based on at least one of a sensed temperature associated with the electronic device coupled to the respective evaporator or a sensed pressure of system coolant within the respective evaporator.

3. The cooling system of claim 2, wherein the control unit comprises a controller coupled to control each flow control valve of the plurality of flow control valves based on the at least one of the respective sensed temperature or the respective sensed pressure to maintain the respective sensed temperature within a specified range of operational temperatures for the electronic device associated with the respective evaporator or the sensed pressure within the respective evaporator within a specified range of operational pressures for the desired saturation temperature of system coolant into the evaporator.

4. The cooling system of claim 3, wherein the controller controls each flow control valve of the plurality of flow control valves based on the respective sensed temperature, and wherein the controller increases the amount of system coolant flow through a flow control valve of the plurality of flow control valves when the sensed temperature associated with the electronic device coupled to the respective evaporator exceeds an upper temperature threshold, and decreases the amount of system coolant through the flow control valve when the sensed temperature associated with the electronic device is below a lower temperature threshold.

5. The cooling system of claim 3, wherein the controller controls each flow control valve of the plurality of flow control valves employing the sensed pressure within the respective evaporator, the controlling comprising increasing the amount of system coolant flow through a flow control valve of the plurality of flow control valves when the sensed pressure in the respective evaporator exceeds an upper pressure threshold, and decreasing the amount of system coolant through the flow control valve when the sensed temperature in the respective evaporator is below a lower pressure threshold.

6. The cooling system of claim 3, wherein when operational, the controller adjusts at least two flow control valves of the plurality of flow control valves to establish different amounts of system coolant flow through at least two coolant branches of the plurality of coolant branches based on, for each coolant branch of the at least two coolant branches, the respective sensed temperature or the respective sensed pressure, to maintain the respective sensed temperature at or below the desired maximum operational temperature of the electronic device associated with the respective evaporator or the sensed pressure within the respective evaporator at or above saturation pressure of the system coolant for the desired saturation temperature of system coolant into the evaporator.

7. The cooling system of claim 1, wherein the control unit comprises a pressure control unit for facilitating maintaining pressure of system coolant within the coolant loop at the system coolant supply side of the plurality of coolant branches within the specific pressure range at or above the saturation pressure of the system coolant for the desired saturation temperature of system coolant into the plurality of evaporators, the pressure control unit comprising:
   a pressure vessel comprising system coolant;
   a pressurizing mechanism associated with the pressure vessel;
   a coolant line coupling system coolant in the pressure vessel in fluid communication with the coolant loop of the cooling system at the system coolant supply side of the plurality of coolant branches; and
   a regulator mechanism coupled to the pressurizing mechanism to facilitate maintaining system coolant within the coolant loop at the system coolant supply side of the plurality of coolant branches at or above the saturation pressure of the system coolant for the desired saturation temperature of system coolant into the plurality of evaporators.

8. The cooling system of claim 7, wherein the pressurizing mechanism comprises a piston disposed within the pressure vessel, and wherein the regulator mechanism comprises a stepper motor coupled to the piston for adjusting position of the piston within the pressure vessel and thus pressure of system coolant within the pressure vessel, and wherein the pressure control unit further comprises:
   a pressure sensor for sensing pressure of system coolant within one of the pressure vessel or the coolant loop; and
   a controller coupled to the pressure sensor and to the stepper motor, wherein the controller controls positioning of the piston within the pressure vessel via the stepper motor to maintain pressure of system coolant within the pressure vessel, and hence within the coolant loop at the system coolant supply side of the plurality of coolant branches, equal to or above the saturation pressure of the system coolant for the desired saturation temperature of system coolant into the plurality of evaporators.

9. The cooling system of claim 1, wherein the control unit further comprises a controller for controlling temperature of system coolant at the system coolant supply side of the plurality of coolant branches, and wherein the cooling system further comprises:
   a temperature sensor for sensing temperature of system coolant within the coolant loop;
   a condenser coupled in fluid communication with a system coolant return side of the plurality of coolant branches, the condenser comprising a liquid-to-liquid heat exchanger for cooling system coolant within the coolant loop; and
   a flow control valve associated with one of a facility coolant supply line or a facility coolant return line coupled to the liquid-to-liquid heat exchanger for adjusting flow of facility coolant through the liquid-to-liquid heat exchanger, and thus, cooling of system coolant passing through the liquid-to-liquid heat exchanger of the condenser dependent on a temperature of system coolant within the coolant loop sensed by the temperature sensor.

10. The cooling system of claim 9, wherein the control unit controls pressure and temperature of system coolant at the system coolant supply side of the plurality of coolant branches so that system coolant into the plurality of evaporators is a saturated liquid or a sub-saturation-cooled liquid relative to the desired saturation temperature of system coolant into the plurality of evaporators.

11. The cooling system of claim 9, wherein the controller increases the amount of facility coolant through the flow control valve associated with the one of the facility coolant supply line or the facility coolant return line when the temperature sensed by the temperature sensor is above an upper temperature threshold, and reduces the amount of system coolant through the flow control valve associated with the one of the facility coolant supply line or the facility coolant return line when the temperature of system coolant sensed by the temperature sensor is below a lower temperature threshold.

12. A cooled electronic system comprising:
   a plurality of electronic devices capable of generating differing amounts of heat dependent on the operational states thereof;
   a cooling system for cooling the plurality of electronic devices, the cooling system comprising:
      a plurality of evaporators coupled to the plurality of electronic devices;
      a coolant loop coupled to pass system coolant through the plurality of evaporators, the coolant loop comprising a plurality of coolant branches coupled in parallel, each coolant branch being coupled in fluid communication with a respective evaporator of the plurality of evaporators; and
      a control unit for maintaining pressure of system coolant at a system coolant supply side of the plurality of coolant branches within a specific pressure range at or above saturation pressure of the system coolant for a desired saturation temperature of system coolant into the plurality of evaporators to facilitate two-phase heat transfer in the plurality of evaporators from the plurality of electronic devices to the system coolant at the desired saturation temperature.

13. The cooled electronic system of claim 12, further comprising a plurality of flow control valves, each flow control valve being in fluid communication with an associated coolant branch of the plurality of coolant branches of the coolant loop and facilitating control unit adjustment of system coolant flow through the respective evaporator in fluid communication with the associated coolant branch based on at least one of a sensed temperature associated with the electronic device coupled to the respective evaporator or a sensed pressure of system coolant within the respective evaporator.

14. The cooled electronic system of claim 13, wherein the control unit comprises a controller coupled to control each flow control valve of the plurality of flow control valves based on the at least one of the respective sensed temperature or the respective sensed pressure to maintain the respective sensed temperature within a specified range of operational temperatures for the electronic device associated with the respective evaporator or the sensed pressure within the respective evaporator within a specified range of operational pressures for the desired saturation pressure of system coolant into the respective evaporator, and wherein the controller adjusts at least two flow control valves of the plurality of flow control valves to establish different amounts of system coolant flow through at least two coolant branches of the respective plurality of coolant branches based on, for each coolant branch of the at least two coolant branches, the respective sensed temperature or the respective sensed pressure.

15. The cooled electronic system of claim 12, wherein the control unit comprises a pressure control unit for facilitating maintaining pressure of system coolant within the coolant loop at the system coolant supply side of the plurality of coolant branches at or above the saturation pressure of the system coolant for the desired saturation temperature of system coolant into the plurality of evaporators, the pressure control unit comprising:
   a pressure vessel comprising system coolant;
   a pressurizing mechanism associated with the pressure vessel;
   a coolant line coupling system coolant in the pressure vessel in fluid communication with the coolant loop of the cooling system at the system coolant supply side of the plurality of coolant branches; and
   a regulator mechanism coupled to the pressurizing mechanism to facilitate maintaining system coolant within the coolant loop at the system coolant supply side of the plurality of coolant branches at or above the saturation pressure of the system coolant for the desired saturation temperature of system coolant into the plurality of evaporators.

16. The cooled electronic system of claim 15, wherein the pressurizing mechanism comprises a piston disposed within the pressure vessel, and wherein the regulator mechanism comprises a stepper motor coupled to the piston for adjusting position of the piston within the pressure vessel and thus pressure of system coolant within the pressure vessel, and wherein the pressure control unit further comprises:
   a pressure sensor for sensing pressure of system coolant within one of the pressure vessel or the coolant loop; and
   a controller coupled to the pressure sensor and to the stepper motor, wherein the controller controls positioning of the piston within the pressure vessel via the stepper motor to maintain pressure of system coolant within the pressure vessel, and hence within the coolant loop at the system coolant supply side of the plurality of coolant branches, equal to or above the saturation pressure of the system coolant for the desired saturation temperature of system coolant into the plurality of evaporators.

17. The cooled electronic system of claim 12, wherein the control unit further comprises a controller for controlling temperature of system coolant at the system coolant supply side of the plurality of coolant branches, and wherein the cooling system further comprises:
   a temperature sensor for sensing temperature of system coolant within the coolant loop;
   a condenser coupled in fluid communication with a system coolant return side of the plurality of coolant branches, the condenser comprising a liquid-to-liquid heat exchanger for cooling system coolant within the coolant loop; and
   a flow control valve associated with one of a facility coolant supply line or a facility coolant return line coupled to the liquid-to-liquid heat exchanger for adjusting flow of facility coolant through the liquid-to-liquid heat exchanger, and thus, cooling of system coolant passing through the liquid-to-liquid heat exchanger of the condenser dependent on a temperature of system coolant within the coolant loop sensed by the temperature sensor.

18. The cooled electronic system of claim 17, wherein the control unit controls pressure and temperature of system coolant at the system coolant supply side of the plurality of coolant branches so that system coolant into the plurality of evaporators is a saturated liquid or a sub-saturation-cooled liquid relative to the desired saturation temperature of system coolant into the plurality of evaporators.

19. A method of facilitating two-phase heat transfer in a coolant loop of a cooling system, the method comprising:
   coupling a plurality of evaporators to a plurality of electronic devices to be cooled and passing system coolant through the plurality of evaporators in parallel employing a coolant loop, the coolant loop comprising a plurality of coolant branches coupled in parallel, each coolant branch being coupled in fluid communication with a respective evaporator of the plurality of evaporators; and
   regulating pressure of system coolant at a system coolant supply side of the plurality of coolant branches to maintain pressure of system coolant at the system coolant supply side of the plurality of coolant branches within a specific pressure range at or above saturation pressure of the system coolant for a desired saturation temperature of system coolant into the plurality of evaporators to facilitate two-phase heat transfer in the plurality of evaporators from the plurality of electronic devices to the system coolant at the desired saturation temperature.

20. The method of claim 19, further comprising individually controlling flow of system coolant through the plurality of coolant branches of the coolant loop, the individually controlling comprising individually adjusting system coolant flow through the respective evaporator in fluid communication with an associated coolant branch of the plurality of coolant branches based on at least one of a sensed temperature associated with the electronic device coupled to the evaporator or a sensed pressure of system coolant within the evaporator.

\* \* \* \* \*